(12) United States Patent
Korsunsky

(10) Patent No.: US 6,623,284 B1
(45) Date of Patent: Sep. 23, 2003

(54) ELECTRICAL CONNECTOR

(75) Inventor: Iosif R. Korsunsky, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/338,253

(22) Filed: Jan. 7, 2003

(51) Int. Cl.$^7$ ................................................ H01R 12/00
(52) U.S. Cl. ................................................ 439/83; 439/71
(58) Field of Search ............................... 439/83, 70, 71, 439/65, 66, 74, 876, 971

(56) References Cited

U.S. PATENT DOCUMENTS

| | | |
|---|---|---|
| 5,997,317 A | 12/1999 | Pei et al. |
| 6,024,584 A | 2/2000 | Lemke et al. |
| 6,042,389 A | 3/2000 | Lemke et al. |
| 6,079,991 A | 6/2000 | Lemke et al. |
| 6,093,035 A | 7/2000 | Lemke et al. |
| 6,139,336 A | 10/2000 | Olson |
| 6,164,983 A | 12/2000 | Lemke et al. |
| 6,293,808 B1 * | 9/2001 | Ochiai ........................ 439/70 |
| 6,325,644 B1 | 12/2001 | Lemke et al. |
| 6,352,436 B1 * | 3/2002 | Howard ...................... 439/82 |
| 6,533,590 B1 * | 3/2003 | Lee et al. .................... 439/83 |

* cited by examiner

*Primary Examiner*—Tho D. Ta
(74) *Attorney, Agent, or Firm*—Wei Te Chung

(57) ABSTRACT

An electrical connector (1) includes a dielectric housing (2) having a mounting surface (202) and a number of passageways (22) extending through the mounting surface and a number of contacts (3, 3') received in the passageways of the housing. Each passageway receives dual contacts therein. The dual contacts have mating portions (32) for engagement with a complementary connector (5) and angled tail portions (34, 34') extending opposing to each other to form a recess (36) therebetween. A solder ball (4) is positioned in the recess of the corresponding dual contacts and attached to the tail portions of the corresponding dual contacts for soldering to a circuit substrate (8) on which the connector is seated.

7 Claims, 3 Drawing Sheets

ELECTRICAL CONNECTOR

CROSS-REFERENCES TO RELATED APPLICATION

This patent application is related to a U.S. patent application Ser. No. 10/095,983, filed on Mar. 11, 2002, entitled "ELECTRICAL CONNECTOR PROVIDING RELIABLE ELECTRICAL INTERCONNECTION WITH MATED DEVICES" and assigned to the same assignee with this patent application. The disclosures of this patent application are wholly incorporated herein by reference.

BACKGROUND OF THE INVENTION

1. Field of the Invention

The present invention relates to electrical connectors, and particularly to electrical connectors that are attached to a circuit substrate by use of solder balls attached to contacts.

2. Description of Related Art

As the size of electronic devices in which circuit boards are installed decreases, the density of electrical connectors positioned on the board must increase so as to meet the requirements. Consequently, the electrical connectors with numerous contacts extending therefrom should be mounted on the board in such a manner so as to occupy a minimal area of board real estate.

It is well known that surface mount technology (SMT) is widely used for connection of the contacts of the electrical connector to the printed circuit board on which the connector is seated. Conductive pads on the printed circuit board can be closely spaced, thereby allowing more contacts to be mounted in the same area of the board. Subsequently, the electrical connectors are developed to have solder balls attached on solder tails of the contacts, i.e., ball grid array (BGA) connectors for ensuring a reliable electrical connection between the connectors and the printed circuit board.

U.S. Pat. No. 5,997,317 issued to Pei et al. on Dec. 7, 1999 discloses a typical ball grid array (BGA) connector. This ball grid array connector comprises an insulating housing defining a plurality of passageways between a mating face and an opposite mounting face, and a plurality of contacts received in the passageways of the housing. Each contact includes a mating portion and a dish-shaped solder portion substantially perpendicular to the mating portion. After the contacts are installed in the insulating housing, a solder ball is attached to a bottom of the dish-shaped solder portion. The solder ball is then soldered on a conductive pad of a printed circuit board for mounting the connector on the printed circuit board. However, the contacts are difficult to make due to their complicated shape, thereby increasing the manufacturing cost.

U.S. Pat. No. 6,139,336 issued to Olson on Oct. 31, 2000 discloses a ball grid array connector of another type. The ball grid array connector comprises an insulating housing defining a plurality of passageways each having a recess in a mounting surface thereof, a plurality of contacts received in the passageways and a solder ball fused to a tail end of each contact for connection of the connector to a circuit substrate. The tail end of the contact terminates in the recess that facilitates the attachment of the solder ball to the end of the contact.

The ball grid array connectors, which have the recesses in the mounting surface of the housing for positioning the solder balls as disclosed in the '336 patent, can be further referred to U.S. Pat. Nos. 6,024,584, 6,079,991, 6,093,035, 6,164,983, 6,325,644 and 6,042,389.

However, the structure of the housing becomes complicated due to the recesses in the mounting surface, thereby increasing the difficulty of manufacturing the housing.

Hence, the present invention aims to provide a ball grid array connector of new type.

SUMMARY OF THE INVENTION

Accordingly, it is an object of the present invention to provide a ball grid array connector facilitating attachment of fusible elements which are to be soldered to a circuit substrate on which the connector is mounted.

In order to achieve the object set forth, a ball grid array connector in accordance with the present invention comprises a dielectric housing having a mounting surface and a plurality of passageways extending through the mounting surface and a plurality of contacts received in the passageways of the housing. Each passageway receives dual contacts therein. The dual contacts have mating portions for engagement with a complementary connector and angled tail portions extending opposing to each other to form a recess therebetween. A plurality of fusible elements each is positioned in the recess of the corresponding dual contacts and attached to the tail portions of the corresponding dual contacts for soldering to a circuit substrate on which the connector is seated.

Other objects, advantages and novel features of the invention will become more apparent from the following detailed description when taken in conjunction with the accompanying drawings.

DETAILED DESCRIPTION OF THE INVENTION

Reference will now be made in detail to the preferred embodiment of the present invention.

Figure 1:
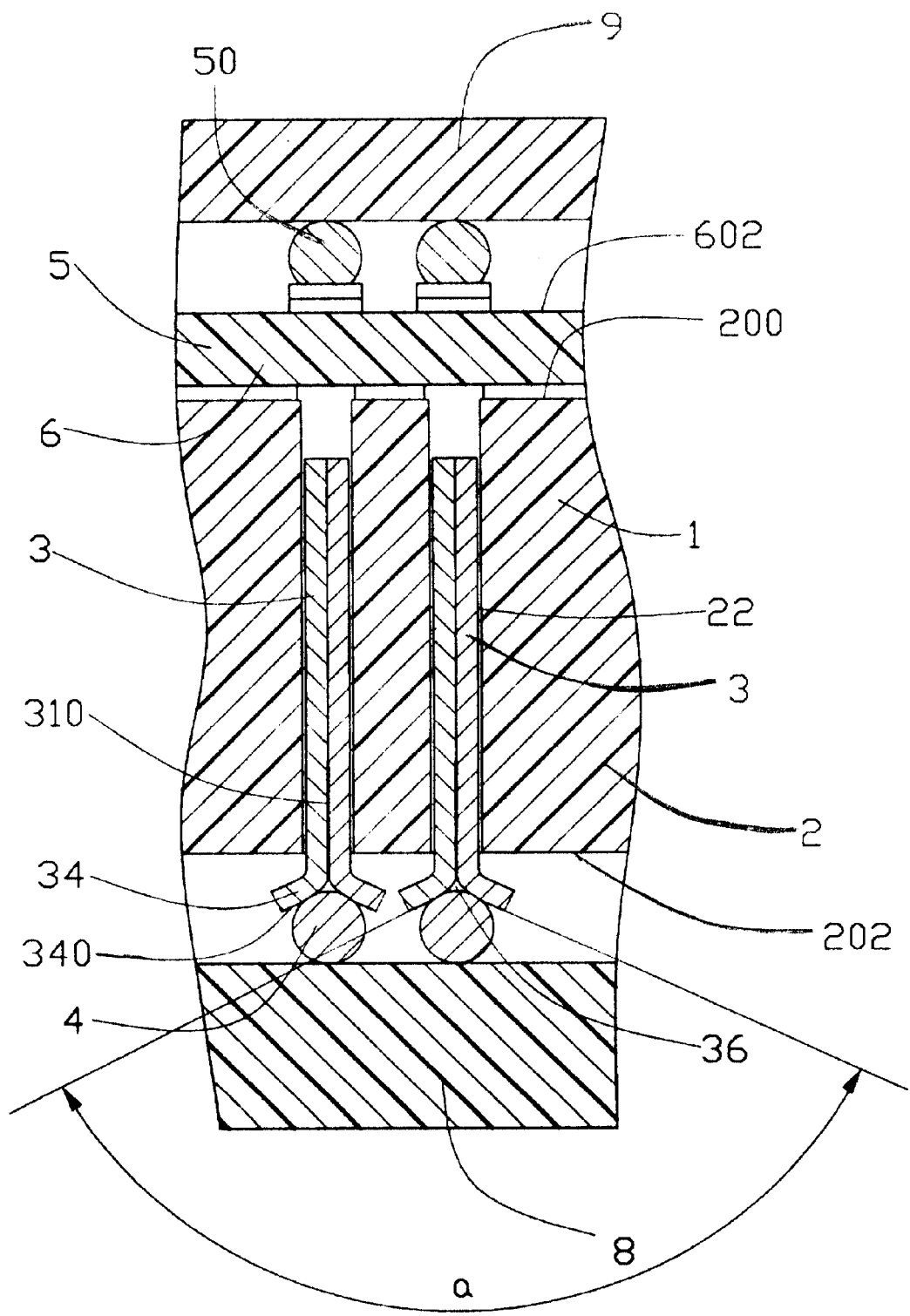
FIG. 1 is a partial cross-sectional view showing a ball grid array connector in accordance with the present invention engaged with a complementary ball grid array connector, and first and second circuit substrates respectively connection with the BGA connector and the complementary BGA connector.
Figure 2:
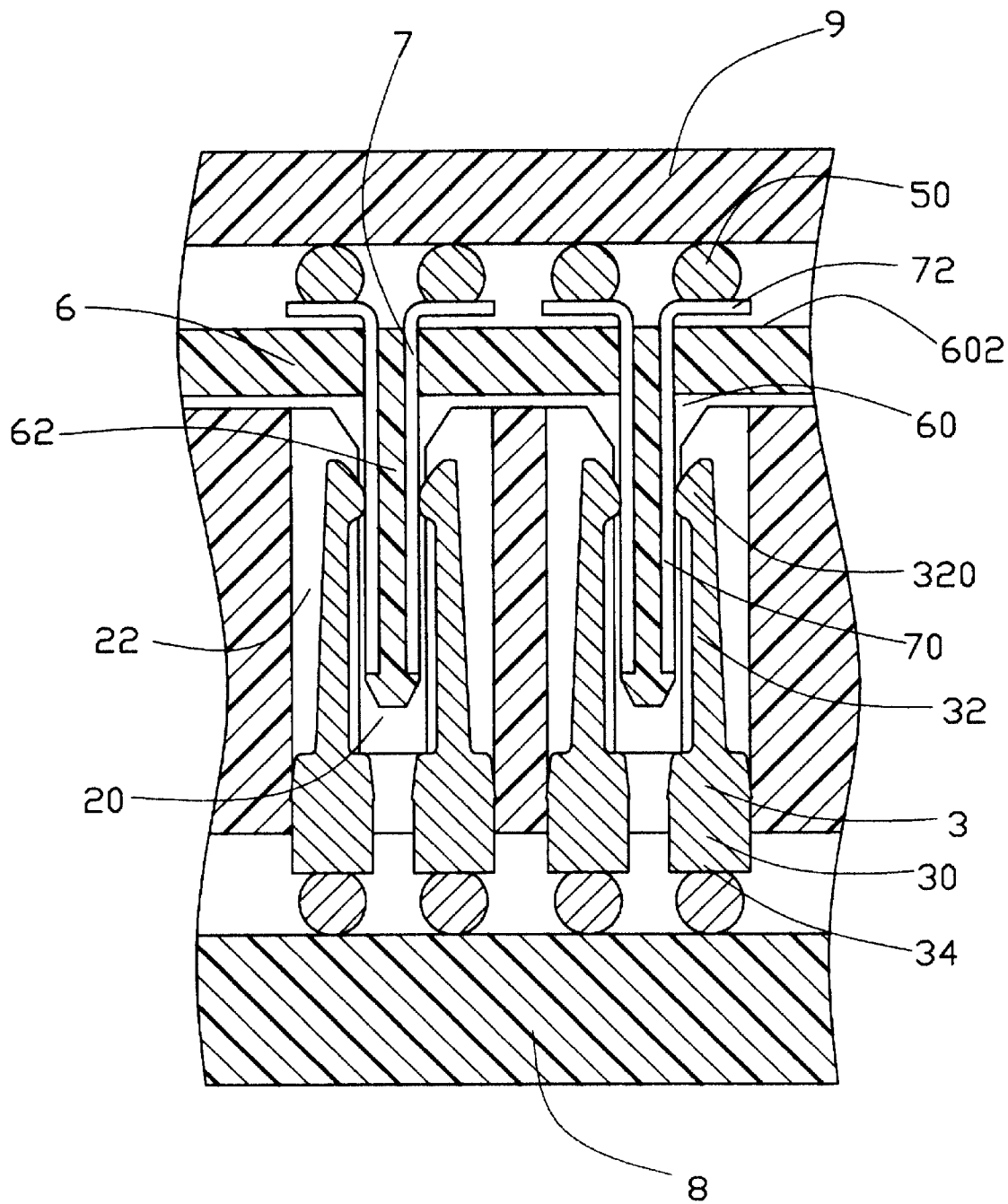
FIG. 2 is a view similar to FIG. 1 but taken from a perspective substantially perpendicular to FIG. 1.

Referring to FIGS. 1 and 2, an electrical connector 1 in accordance with the present invention comprises an elongated dielectric housing 2 defining a receiving slot 20 in a mating surface 200 along a longitudinal direction thereof and a plurality of passageways 22 formed by two sides of the receiving slot 20 to extend through an opposite mounting surface 202 thereof. For simplicity, only two rows of passageways 22 are shown. It should be noted that the rows of passageways can be increased according to actual requirements. In a typical embodiment, it could be a 8×15 arrangement.

A plurality of metal contacts 3 are received in the passageways 22 of the housing 2. Each contact 3 includes a body portion 30 having an interferential engagement with the corresponding passageway 22, a mating portion 32 upwardly extending from an upper end of the body portion 30 with an engagement 320 projecting into the receiving slot 20 for electrical connection with a complementary connector 5 and an angled tail portion 34 extending downwardly and laterally from a lower end of the body portion 30. The angled tail portion 34 is substantially perpendicular with respect to the mating portion 32. The tail portion 34 has a curved surface 340 with a fusible element 4 attached thereto.

There are dual contacts 3 arranged in one passageway 22 of the housing 2 in a side-by-side manner by soldering or solderless abutment, as best shown in FIG. 1. Even the dual contacts 3 are pressed toward each other, it is eventually unavoidable that there is a tiny gap therebetween and which creates a situation for wicking when the tail portions 34 are soldered. In the preferred embodiment of the present invention, the dual contacts 3 has a coating 310 disposed between lower sections thereof adjacent to the angled tail portions 34. The coating 310 is melted by a hot bar to combine the dual contacts 3 such that there is no gap between the lower sections of the dual contacts 3, thereby obtaining anti-wicking function when the fusible element 4 is later fused to the angled tail portions 34 of the dual contacts 3 and then is soldered to a first printed circuit board 8. The coating 310 generally consists of 93% Sn and 7% Pb and has a melting point in the range of about 350–450° C. which is higher than that of the fusible element 4 but lower than that of the metal material of the contacts 3. It is noted that the coating 310 between the dual contacts 3 can also be established by glue or other suitable bonding materials.

The angled tail portions 34 of the dual contacts 3 extend downwardly beyond the mounting surface 202 of the housing 2. A recess 36 is formed between the angled tail portions 34 of the dual contacts 3 which look like two opposite split branches to form an obtuse angle α therebetween, as best shown in FIG. 1. The recess 36 is important for positioning the corresponding fusible element 4 to the angled tail portions 34 of the dual contacts 3 before the fusible element 4 is fused to the angled tail portions 34.

In the preferred embodiment of the present invention, the fusible element 4 is a solder ball. The solder ball 4 is positioned in the recess 36 to be fused onto the tail portions 34 of the dual contacts 3. It is appreciated that the solder balls 4 can be attached to the tail portions 34 of the contacts 3 before or after the process in which the contacts 3 are installed into the housing 2. The solder ball 4 is then soldered to the first printed circuit board 8 for mounting the connector 1 on the first printed circuit board 8.

It is noted that the connector 1 of the present invention can be easily formed since the configuration of the contacts 3 and the housing 2 is simple, thereby saving the manufacturing cost.

Figure 3:
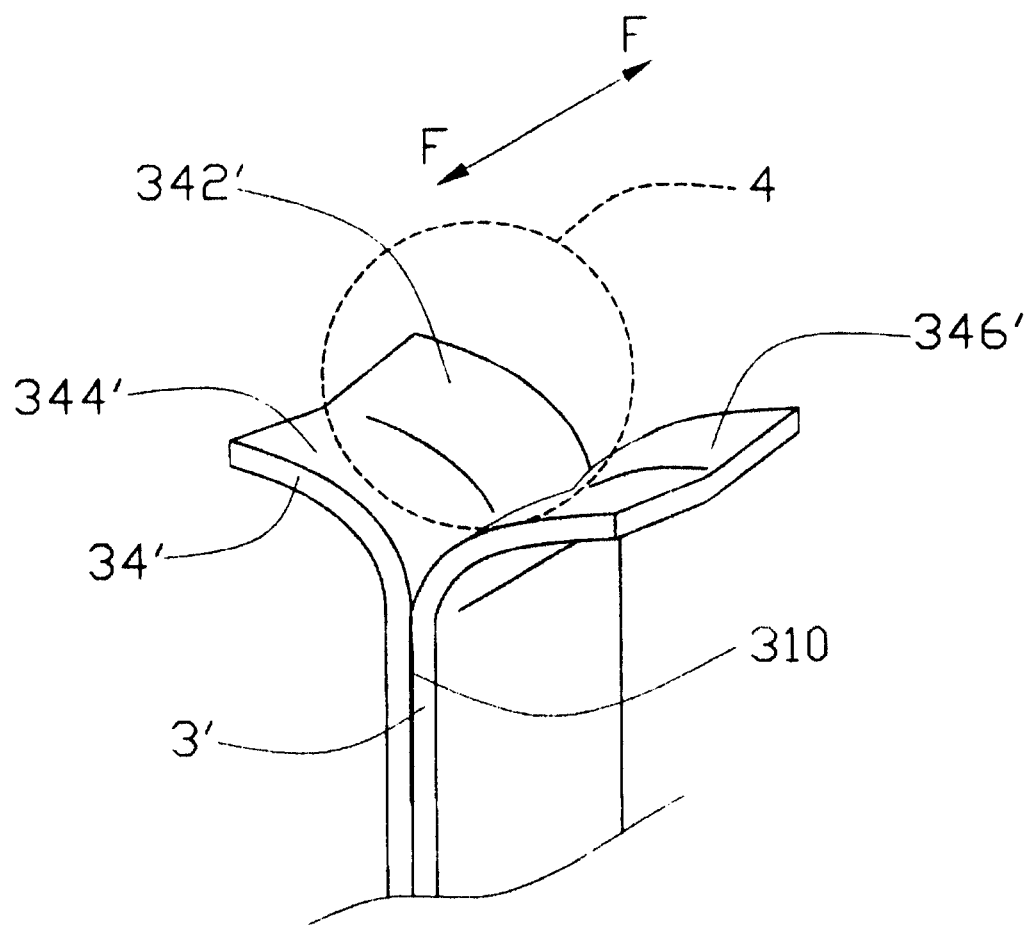
FIG. 3 is an enlarged perspective view showing tail portions of dual contacts in accordance with another embodiment of the present invention.

Referring to FIG. 3, tail portions 34' of dual contacts 3' in accordance with another embodiment of the present invention are schematically shown. The configuration of the tail portions 34' of the dual contacts 3' is substantially the same as the tail portions 34 except that a V-shaped notch 346' is formed at a distal end of each angled tail portion 34'. The angled tail portion 34' is divided into a first section 342' and a second sections 344' by the notch 346' for supporting the solder ball 4 in an F direction. It is preferable that the V-notch 346' is formed before the tail portion 34' is formed. However, the tail portions 346' can be formed with the V-shaped notch 346' after the tail portion 346' are angled.

The complementary connector 5 has a configuration substantially identical to the conventional board to board plug connector. The complementary connector 5 comprises a dielectric housing 6 defining a receiving cavity 60 with an elongated tongue 62 extending thereinto and two rows of contacts 7 received in the housing 6. The contacts 7 include mating portions 70 positioned on opposite sides of the tongue 62 and tail portions 72 substantially perpendicular to the mating portions 70. The tail portions 72 extend beyond a mounting surface 602 of the housing 2 and has solder balls 50 attached thereon. The solder balls 50 are soldered to a second printed circuit board 9 for mounting the connector 5 on the second printed circuit board 9.

When the electrical connector 1 is inserted into the receiving cavity 60 of the complementary connector 5, the engagements 320 of the contacts 3 of the connector 1 engage with the mating portions 70 of the contacts 7 of the complementary connector 5, thereby establishing an electrical connection between the first printed circuit board 8 and the second printed circuit board 9.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for soldering to a circuit substrate, comprising:

a dielectric housing having a mounting surface and a plurality of passageways extending through the mounting surface;

a plurality of contacts received in the passageways of the housing, each passageway receiving dual contacts therein, the dual contacts having mating portions for engagement with a complementary connector and angled tail portions extending opposing to each other to define a recess therebetween; and a plurality of fusible elements each positioned in the recess of the corresponding dual contacts and attached to the tail portions of the corresponding dual contacts for soldering to the circuit substrate;

wherein the dual contacts are side-by-side arranged in the passageway;

wherein the tail portions of the dual contacts extend beyond the mounting surface of the housing.

2. The electrical connector as claimed in claim 1, wherein each of the angled tail portions of the dual contacts defines a V-shaped notch at a distal end thereof.

3. The electrical connector as claimed in claim 1, wherein the tail portions of the contacts are substantially perpendicular to the mating portions.

4. The electrical connector as claimed in claim 1, wherein the tail portions of the dual contacts form an obtuse angle therebetween.

5. The electrical connector as claimed in claim 1, wherein the fusible elements are solder balls.

6. The electrical connector as claimed in claim 1, wherein the dual contacts has a coating disposed between lower sections thereof adjacent to the angled tail portions.

7. The electrical connector as claimed in claim 6, wherein the coating is consisted of 93% Sn and 7% Pb.

* * * * *